(12) United States Patent
Zhang et al.

(10) Patent No.: US 9,159,677 B2
(45) Date of Patent: Oct. 13, 2015

(54) METHODS OF FORMING SEMICONDUCTOR DEVICE STRUCTURES

(75) Inventors: Xinyu Zhang, Bristow, VA (US); Soichi Sugiura, Bristow, VA (US); Yu Zeng, Woodbridge, VA (US)

(73) Assignee: Micron Technology, Inc., Boise, ID (US)

( * ) Notice: Subject to any disclaimer, the term of this patent is extended or adjusted under 35 U.S.C. 154(b) by 22 days.

(21) Appl. No.: 13/590,928

(22) Filed: Aug. 21, 2012

(65) Prior Publication Data

US 2014/0054755 A1 Feb. 27, 2014

(51) Int. Cl.
*H01L 23/552* (2006.01)
*H01L 23/532* (2006.01)

(52) U.S. Cl.
CPC .......... *H01L 23/552* (2013.01); *H01L 23/5329* (2013.01); *H01L 23/53295* (2013.01); *H01L 2924/0002* (2013.01)

(58) Field of Classification Search
CPC ............ H01L 23/53295; H01L 23/522; H01L 23/5329
USPC ............ 257/635, E33.068, E33.069; 438/636
See application file for complete search history.

(56) References Cited

U.S. PATENT DOCUMENTS

| 6,410,210 | B1 * | 6/2002 | Gabriel .......................... 430/315 |
| 6,765,254 | B1 | 7/2004 | Hui et al. |
| 6,833,581 | B1 | 12/2004 | Hui et al. |
| 6,894,342 | B1 | 5/2005 | Hui et al. |
| 2002/0105988 | A1 * | 8/2002 | Park et al. ........................ 372/45 |
| 2008/0187018 | A1 * | 8/2008 | Li ............................... 372/50.11 |
| 2011/0188807 | A1 | 8/2011 | Fattal et al. |

* cited by examiner

*Primary Examiner* — Amar Movva
(74) *Attorney, Agent, or Firm* — TraskBritt

(57) ABSTRACT

A method of forming a semiconductor device structure comprises forming at least one reflective structure comprising at least two dielectric materials having different refractive indices over at least one radiation-sensitive structure, the at least one reflective structure configured to substantially reflect therefrom radiation within a predetermined wavelength range and to substantially transmit therethrough radiation within a different predetermined wavelength range. Additional methods of forming a semiconductor device structure are described. Semiconductor device structures are also described.

19 Claims, 5 Drawing Sheets

METHODS OF FORMING SEMICONDUCTOR DEVICE STRUCTURES

TECHNICAL FIELD

Embodiments of the disclosure relate to the field of semiconductor device design and fabrication. More specifically, embodiments of the present disclosure relate to methods of forming semiconductor device structures, and to related semiconductor device structures.

BACKGROUND

Plasma treatment processes, such as plasma etching or deposition processes, are frequently used during the fabrication of semiconductor devices for integrated circuits. For example, during the fabrication of complementary metal oxide semiconductor (CMOS) devices, plasma etching processes can be used after CMOS transistor formation to produce one or more structures (e.g., contacts, bond pads, trenches, etc.). However, plasma treatment processes produce wavelengths of radiation that can negatively affect CMOS device performance, reliability, and durability. For instance, exposure to certain wavelengths of produced ultraviolet radiation may result in one or more of defects, impurities, and broken chemical bonds in CMOS transistors.

Conventional methods of reducing defects, impurities, and broken chemical bonds resulting from exposing radiation-sensitive structures (e.g., CMOS transistors) to ultraviolet radiation include forming at least one radiation-absorbing material (e.g., an anti-reflective coating) over the radiation-sensitive structures. Unfortunately, the efficacy of the radiation-absorbing material is largely dependent on the thickness of the radiation-absorbing material. For example, thicker radiation-absorbing materials are typically required to impede radiation transmittance at higher radiation intensities, resulting in increased material expense and the formation of larger semiconductor device structures. In addition, the radiation-absorbing material can disadvantageously limit or prevent the use of various photolithographic processes (e.g., those utilizing lower wavelengths of radiation, such as wavelengths less than or equal to about 193 nanometers) in the formation of semiconductor device structures.

A need, therefore, exists for simple and cost-efficient methods to at least reduce, if not eliminate, at least the aforementioned problems.

DETAILED DESCRIPTION

Figure 1A:
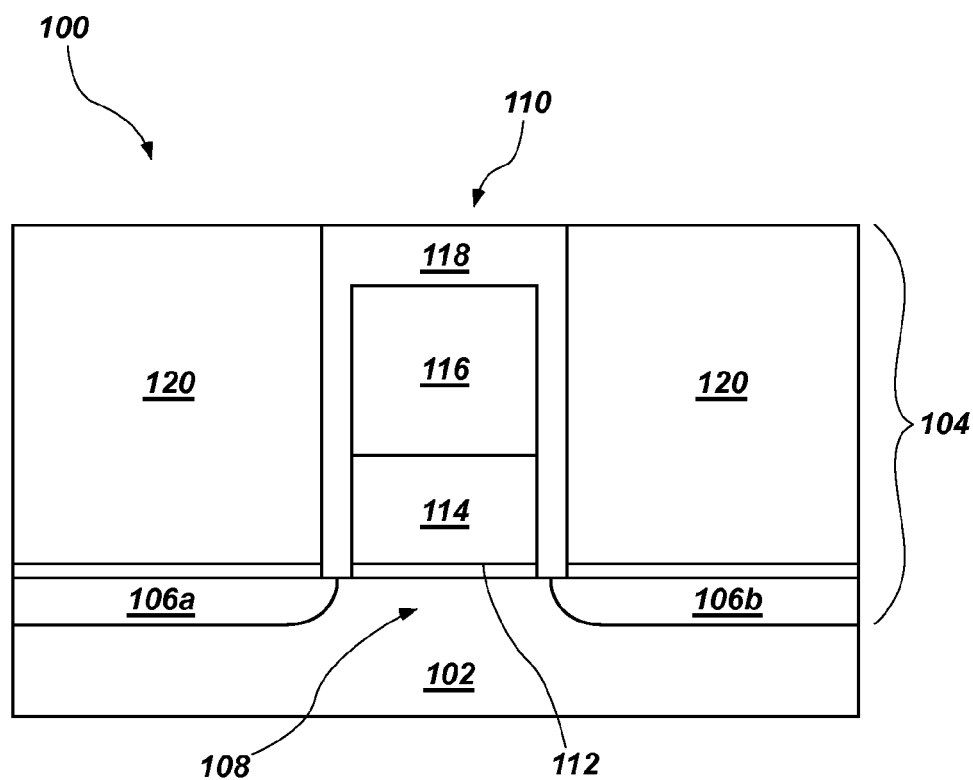
FIGS. 1A and 1B are cross-sectional views illustrating different process stages and structures for a method of forming a semiconductor device structure in accordance with embodiments of the disclosure.

Methods of forming semiconductor device structures are disclosed, as are related semiconductor device structures. In some embodiments, a method of forming a semiconductor device structure includes forming at least one reflective structure on or over at least one structure or material, such as at least one radiation-sensitive structure. As used herein, the term "radiation" means and includes all types of electromagnetic radiation, including ultraviolet (UV) radiation. As used herein, the term "radiation-sensitive structure" refers to a structure or material exhibiting undesired chemical bond breakage (e.g., covalent bond breakage), defect activation, and/or impurity formation upon exposure to at least some wavelengths of radiation. The at least one reflective structure may include at least two dielectric materials having different refractive indices, and may be formed to exhibit a desired reflectivity and to selectively reflect radiation within a predetermined wavelength range. The presence of the at least one reflective structure on the semiconductor device structure may at least partially protect the radiation-sensitive structure from detrimental exposure to radiation produced in association with subsequent processing of the semiconductor device structure, which may improve semiconductor device reliability, performance, and durability.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided herein does not form a complete process flow for forming a semiconductor device structure, and the semiconductor device structures described below do not form a complete semiconductor device. Only those process acts and structures necessary to understand the embodiments of the disclosure are described in detail below. Additional acts to form the complete semiconductor device may be performed by conventional fabrication techniques. Also note, any drawings accompanying the application are for illustrative purposes only, and are thus not drawn to scale. Additionally, elements common between figures may retain the same numerical designation.

As used herein, relational terms, such as "first," "second," "top," "bottom," "upper," "lower," "over," "under," etc., are used for clarity and convenience in understanding the disclosure and accompanying drawings and do not connote or depend on any specific preference, orientation, or order, except where the context clearly indicates otherwise.

As used herein, the term "substantially," in reference to a given parameter, property, or condition, means to a degree that one skilled in the art would understand that the given parameter, property, or condition is met with a small degree of variance, such as within acceptable manufacturing tolerances.

As used herein, the term "substrate" means and includes a base material or construction upon which additional materials are formed. The substrate may be a semiconductor substrate, a base semiconductor layer on a supporting structure, a metal electrode or a semiconductor substrate having one or more layers, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Figure 1B:
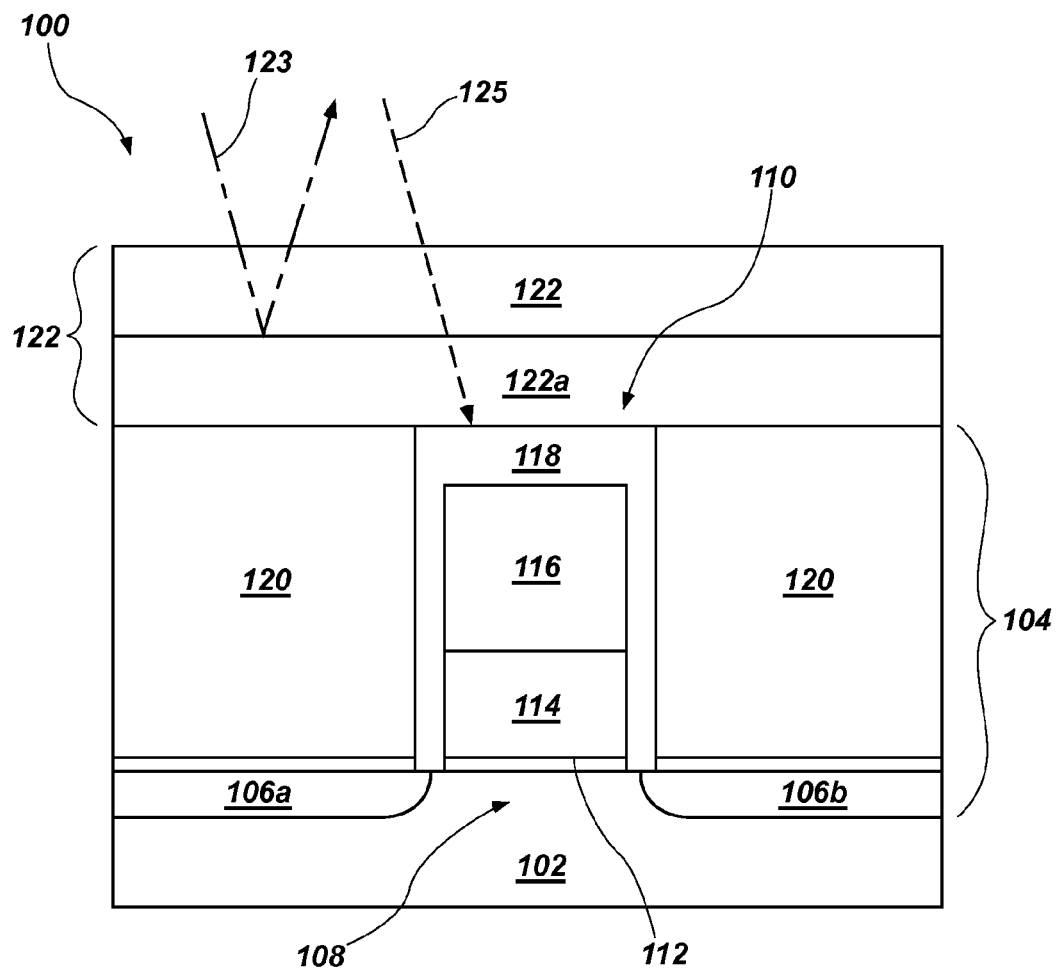

FIGS. 1A and 1B, are simplified partial cross-sectional views illustrating embodiments of a method of forming a semiconductor device structure that includes forming at least one reflective structure on or over at least one radiation-sensitive structure. The reflective structure may reduce damage and performance degradation resulting from exposing the radiation-sensitive structure (e.g., a transistor) to radiation within a particular wavelength range. With the description as provided below, it will be readily apparent to one of ordinary skill in the art that the methods described herein may be used in various applications. In other words, the methods of the disclosure may be used whenever it is desired to reflect radiation within a particular range of wavelengths during the formation of a semiconductor device structure.

Referring to FIG. 1A, a semiconductor device structure 100 may include a substrate 102 and at least one radiation-sensitive structure 104. The radiation-sensitive structure 104 may be located in, on, or over the substrate 102. By way of non-limiting example, as depicted in FIG. 1A, the radiation-sensitive structure 104 may be a transistor, such as a CMOS transistor, including source and drain regions 106a, 106b formed in the substrate 102, a channel region 108 formed between the source and drain regions 106a, 106b, and a gate structure 110 formed on or over the channel region 108 and at least partially surrounded (e.g., laterally surrounded) by an electrically insulative material 120. The gate structure 110 may include, for example, a gate oxide 112 formed on or over the channel region 108, a first conductive material 114 (e.g., a polysilicon, a polycide, etc.) formed on or over the gate oxide 112, a second conductive material 116 (e.g., a more conductive material than the first conductive material 114, such as a more conductive metal silicide material) formed on or over the first conductive material 114, and a capping material 118 (e.g., an electrically insulating material, such as a silicon nitride material) formed on or over each of an upper surface of the second conductive material 116 and sidewalls of the gate oxide 112, the first conductive material 114, and the second conductive material 116. Each of the substrate 102 and the radiation-sensitive structure 104 may be formed using conventional techniques, which are not described in detail herein.

Referring to FIG. 1B, at least one reflective structure 122, which may also be referred to as a distributed Bragg reflector (DBR), may be formed on or over at least the radiation-sensitive structure 104. The reflective structure 122 is formed to include a stack of at least two dielectric materials having different refractive indices. For example, as shown in FIG. 1B, the reflective structure 122 may include a dielectric material 122a formed on or over the gate structure 110 and the electrically insulative material 120, and another dielectric material 122b formed on the dielectric material 122a. The dielectric material 122a may have a higher refractive index or may have a lower refractive index than the another dielectric material 122b. The different refractive indices of adjacent dielectric materials of the reflective structure 122 (e.g., the dielectric material 122a, and the another dielectric material 122b) at least partially enable the reflective structure 122 to reflect radiation, as described in further detail below.

The reflective structure 122 may be formed and configured to exhibit a desired reflectivity. For example, for a reflective structure 122 including at least one pair of adjacent dielectric materials, a reflectivity of the reflective structure 122 may be tailored according to the following equation:

$$R = \left[ \frac{n_0(n_2)^{2N} - n_s(n_1)^{2N}}{n_0(n_2)^{2N} + n_s(n_1)^{2N}} \right]^2, \quad (1)$$

where R is the reflectivity of the reflective structure 122, $n_0$ is a refractive index of a material overlying the reflective structure 122, $n_s$ is a refractive index of a material underlying the reflective structure 122, N is the number of pairs of the adjacent dielectric materials in the reflective structure 122, and $n_1$ and $n_2$ are the respective refractive indices of the adjacent dielectric materials. As indicated by Equation 1, increasing at least one of a refractive index contrast (i.e., difference in refractive indices between the adjacent dielectric materials) and the number of pairs of the adjacent dielectric materials may increase the reflectivity of the reflective structure 122. As a non-limiting example, the reflective structure 122 may reflect greater than or equal to about 60 percent, such as greater than or equal to about 90 percent, or greater than or equal to about 95 percent, or greater than or equal to about 99 percent, or greater than or equal to about 99.5 percent of radiation within a particular wavelength range.

The reflective structure 122 may be formed and configured to reflect a broad range of radiation wavelengths. For example, for a reflective structure 122 comprising at least one pair of adjacent dielectric materials, a photonic stopband of the reflective structure 122 may be tailored according to the following equation:

$$\Delta\lambda_0 = \frac{4\lambda_0}{\pi} \arcsin\left(\frac{n_2 - n_1}{n_2 + n_1}\right), \quad (2)$$

where $\Delta\lambda_0$ is the photonic stopband, $\lambda_0$ is a central wavelength of the band, and $n_1$ and $n_2$ are as previously described. As used herein, the term "photonic stopband" refers to a wavelength range susceptible to reflection by the reflective structure 122. Wavelengths of radiation outside of the photonic stopband (e.g., below the wavelength range) are able to pass through the reflective structure 122 with substantially no reflection. The reflective structure 122 may be tailored to exhibit a desired photonic stopband. As indicated by equation 2, increasing the refractive index contrast between the adjacent dielectric materials of the reflective structure 122 (e.g., the dielectric material 122a, and the another dielectric material 122b) broadens the photonic stopband $\Delta\lambda_0$. Thus, as depicted in FIG. 1B, the reflective structure 122 may be formed to selectively reflect particular radiation wavelengths, illustrated as dashed line 123, and transmit other radiation wavelengths, illustrated as dashed line 125. By way of non-limiting example, the reflective structure 122 may be formed to exhibit a photonic stopband of greater than or equal to about 100 nanometers (nm), such as greater than about 193 nm. In some embodiments, the reflective structure 122 may be formed to reflect ultraviolet radiation produced during plasma treatment processes, such as ultraviolet radiation within a wavelength range of from about 200 nm to about 400 nm, such as from about 250 nm to about 400 nm. The reflective structure 122 may substantially reflect (i.e., reflect greater than or equal to about 99 percent) of radiation within the range of from about 200 nm to about 400 nm, and may substantially transmit (i.e., transmit greater than or equal to about 99 percent) of radiation exhibiting a wavelength of less than 200 nm. As compared to conventional methods of protecting a radiation-sensitive structure, such as methods utilizing at least one radiation-absorbing structure (e.g., an anti-reflective coating), the methods of the disclosure may facilitate increased selectivity for longer wavelengths of radiation (e.g., wavelengths greater than or equal to about 200 nm), while still enabling the use of shorter wavelengths of radiation (e.g., wavelengths less than or equal to about 193 nm) for photolithographic processes (e.g., photoscanning processes). The methods of the disclosure may thus facilitate the reflection of wavelengths of radiation that may otherwise damage the radiation-sensitive structure 104, while enabling the transmission of wavelengths of radiation that may be beneficial to the processing of the radiation-sensitive structure 104.

Accordingly, a method of forming a semiconductor device structure comprises forming at least one reflective structure comprising at least two dielectric materials having different refractive indices over at least one radiation-sensitive structure, the at least one reflective structure configured to substantially reflect therefrom radiation within a predetermined wavelength range and to substantially transmit therethrough radiation within a different predetermined wavelength range.

Furthermore, a semiconductor device structure of the disclosure comprises at least one structure on a substrate, and a reflective structure over the at least one structure and configured to selectively reflect greater than or equal to about 60 percent of radiation within a wavelength range of from about 200 nm to about 400 nm.

In addition, a method of processing a semiconductor device structure including a reflective structure over a radiation-sensitive structure comprises substantially reflecting UV radiation within a predetermined wavelength range away from the radiation-sensitive structure with the reflective structure, and substantially transmitting UV radiation outside of the predetermined wavelength range through the reflective structure to the radiation-sensitive structure.

Further, a semiconductor device structure of the disclosure comprises a radiation-sensitive structure, and a reflective structure configured to substantially reflect UV radiation within a predetermined wavelength range, and to substantially allow transmission of UV radiation outside of the predetermined wavelength range.

Any combination of dielectric materials may be used to form the reflective structure 122 so long as the combination of materials results in a suitable refractive index contrast of the adjacent dielectric materials of the reflective structure 122, as previously described. A first of the adjacent dielectric materials (e.g., the dielectric material 122a) may, for example, be formed from silicon dioxide ($SiO_2$), silicon nitride ($Si_3N_4$), titanium dioxide ($TiO_2$), zirconium dioxide ($ZrO_2$), hafnium dioxide ($HfO_2$), tantalum oxide ($Ta_2O_5$), magnesium oxide (MgO), a Group III-V compound, or a Group II-IV compound. In turn, a second of the adjacent dielectric materials (e.g., the another dielectric material 122b) may, for example, be formed from a different dielectric material from the list above. By way of non-limiting example, the first of the adjacent dielectric materials may be selected to have a refractive index of greater than or equal to about 1.5, such as greater than or equal to about 1.7, or greater than or equal to about 2.0, and the second of the adjacent dielectric materials may be selected to have a refractive index of less than or equal to about 2.0, such as less than or equal to about 1.5, or less than or equal to about 1.4. In some embodiments, the first of the adjacent dielectric materials is $Si_3N_4$, which has a refractive index of 2.0, and the second of the adjacent dielectric materials is $SiO_2$, which has a refractive index of 1.48.

Each dielectric material of the reflective structure 122 may be formed at any suitable thickness. The thickness of each of the dielectric materials may at least partially depend on the radiation wavelengths desired to be reflected and on a desired reflectivity of the reflective structure 122. The thickness of each of the dielectric materials may, for example, be tailored to increase the reflection of a particular radiation wavelength or radiation wavelength range. As a non-limiting example, for normal incidence, the thickness of each of the dielectric materials may be a quarter of a particular radiation wavelength desired to be reflected (e.g., for a center radiation wavelength of about 200 nm, each of the dielectric materials may have a thickness of about 500 Angstroms). If the thickness of each of the dielectric materials is about one quarter of the particular radiation wavelength, the reflective structure 122 may reflect substantially all radiation having the particular wavelength. If radiation incident with angle, the thickness of each of the dielectric materials may be increased accordingly. In some embodiments, each dielectric material of the reflective structure is formed to have a thickness greater than or equal to about 500 Angstroms (Å). The thickness of each of the dielectric materials (e.g., the dielectric material 122a and the another dielectric material 122b) of the reflective structure 122 may be the same, or at least one of the dielectric materials may have a different thickness than at least one other of the dielectric materials. In addition, the thickness of each of the dielectric materials may be selected independent of radiation intensity considerations. As used herein, the term "radiation intensity" refers to the amount of radiation present in or passing through a given volume per unit of time. Conventional methods of protecting a radiation-sensitive structure from radiation, such as methods utilizing at least one radiation-absorbing structure (e.g., at least one anti-reflective coating), typically require forming thicker radiation-blocking material(s) to sufficiently protect the radiation-sensitive structure at increased radiation intensities. Such conventional methods may thus disadvantageously result in increased material requirements and larger structural dimensions. Conversely, using the methods of the present disclosure, as long as the reflective structure 122 exhibits a sufficient refractive index contrast and the number of adjacent dielectric materials to facilitate a desired reflectivity, each dielectric material of the reflective structure 122 may be formed at a thickness irrespective of radiation intensity.

The dielectric materials of the reflective structure 122 may be formed using conventional processes, such as physical vapor deposition ("PVD"), chemical vapor deposition ("CVD"), or atomic layer deposition ("ALD"). PVD includes, but is not limited to, sputtering, evaporation, or ionized PVD. Such deposition processes are known in the art and, therefore, are not described in detail herein.

After forming the reflective structure 122 on or over the radiation-sensitive structure 104, the semiconductor device structure 100 may be subjected to additional processing to form a semiconductor device that includes the semiconductor device structure 100. By way of non-limiting example, additional materials may be formed on the semiconductor device structure 100 or at least a portion of an additional material on the semiconductor device structure 100 may be removed. By way of non-limiting example, the semiconductor device structure 100 may be subjected to at least one plasma treatment process, including, but not limited to, one or more of a plasma enhanced chemical vapor deposition process (PECVD), a plasma etching process, and a plasma cleaning process. The plasma treatment process may produce ultraviolet radiation within a wavelength range of from about 200 nm to about 400 nm. If the reflective structure 122 were not present, the radiation-sensitive structure 104 would be degraded (e.g., damaged) by the ultraviolet radiation produced as a result of the plasma treatment process. In some embodiments, after forming the reflective structure 122, the semiconductor device structure 100 is subjected to a plasma etching process. The plasma etching process may, for example, be performed after the formation of at least one other material (not shown) on or over at least a portion of the reflective structure 122. The plasma etching process may remove at least a portion of one or more of the other material and the reflective structure 122. The reflective structure 122 may at least partially reflect the ultraviolet radiation (e.g., ultraviolet radiation within a wavelength range of from about 200 nm to about 400 nm) produced during the plasma treatment process to at least partially protect the radiation-sensitive structure 104 from exposure to the ultraviolet radiation. Protecting the radiation-sensitive structure 104 from exposure to the ultraviolet radiation may reduce or eliminate at least one of radiation-based damage, defects, and impurities in the radiation-sensitive structure 104. The reflective structure 122 may, therefore, reduce or eliminate radiation-based performance degradation of the semiconductor device structure 100 and in a semiconductor device including the semiconductor device structure 100.

Accordingly, a method of forming a semiconductor device structure comprises forming at least one reflective structure configured to selectively reflect radiation having a wavelength within a range of from about 200 nm to about 400 nm over at least one material of a semiconductor device structure, and exposing the at least one reflective structure to radiation having a wavelength within a range of from about 200 nm to about 400 nm.

Although FIG. 1B depicts an embodiment of the disclosure where the at least one reflective structure 122 includes a single pair of the dielectric material 122a and the another dielectric material 122b, it will be readily apparent to one of ordinary skill in the art that the at least one reflective structure 122 may be formed and configured differently. By way of non-limiting example and as described in further detail below, FIGS. 2 through 4 illustrate additional embodiments of the disclosure.

Figure 2:
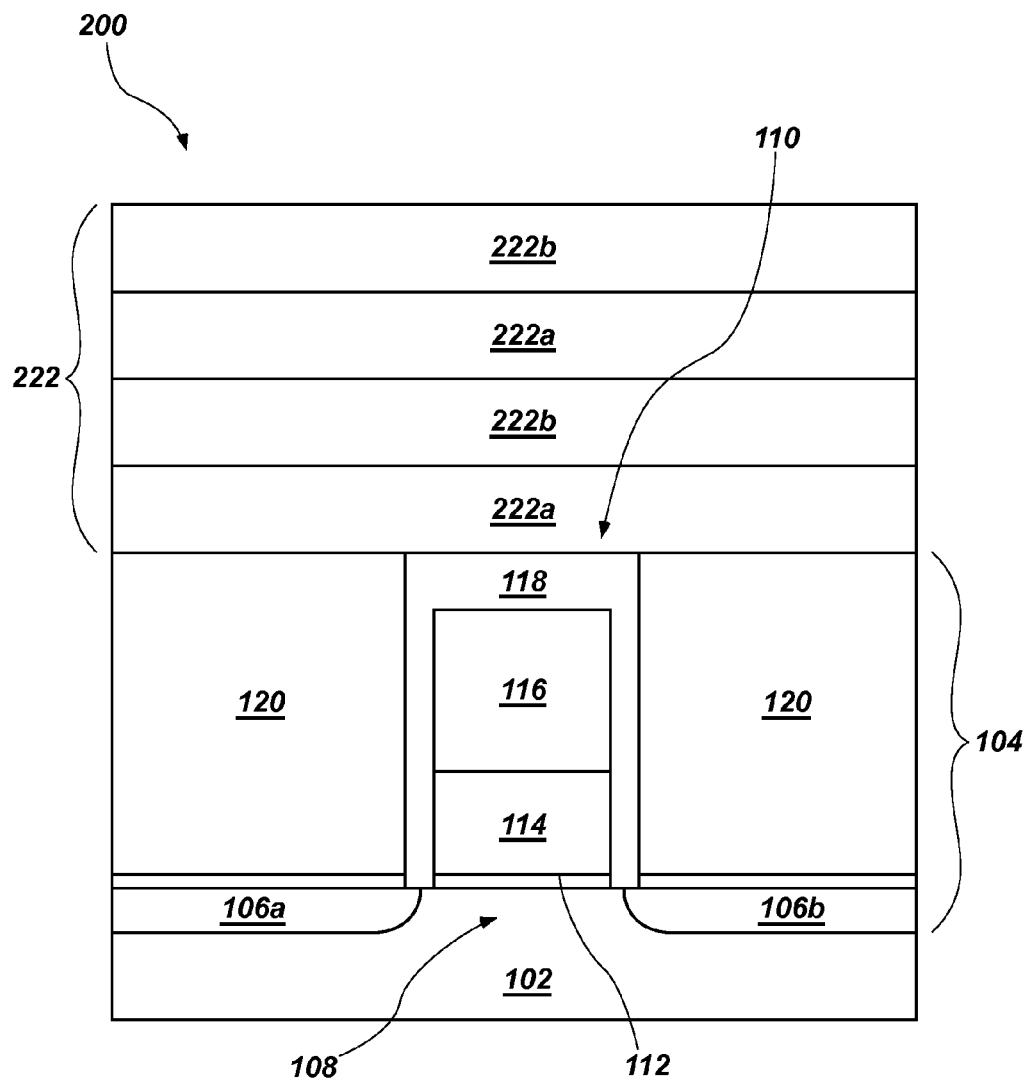
FIG. 2 is a cross-sectional view of a semiconductor device structure in accordance with embodiments of the disclosure.

Referring to FIG. 2, in additional embodiments, a method of forming a semiconductor device structure 200 includes forming at least one reflective structure 222 including a plurality of pairs of a dielectric material 222a and another dielectric material 222b. Put another way, the dielectric material 222a and the another dielectric material 222b may be formed and configured to alternate and periodically repeat throughout a thickness of the reflective structure 222. The dielectric material 222a and the another dielectric material 222b may alternate and repeat a desired number of times. For example, the plurality of pairs of the dielectric material 222a and the another dielectric material 222b may be periodically repeated in accordance with Equation 1 above to achieve a desired reflectivity of the reflective structure 222. The dielectric material 222a and the another dielectric material 222b may be repeated an equal number of times (e.g., such that the reflective structure 222 has an odd number of adjacent dielectric material interfaces), or one of the dielectric material 222a and the another dielectric material 222b may be repeated one more time than the other (e.g., such that the reflective structure 222 has an even number of adjacent dielectric material interfaces). The dielectric material 222a and another dielectric material 222b may be substantially similar to the dielectric material 122a and the another dielectric material 122b previously described with respect to FIG. 1B. The reflective structure 222 may be formed using conventional processes such as PVD, CVD, or ALD, which are not described in detail herein. In addition, after forming the reflective structure 222, the semiconductor device structure 200 may be subjected to additional processing (e.g., at least one plasma treatment process), such as that previously described in relation to the semiconductor device structure 100.

Figure 3:
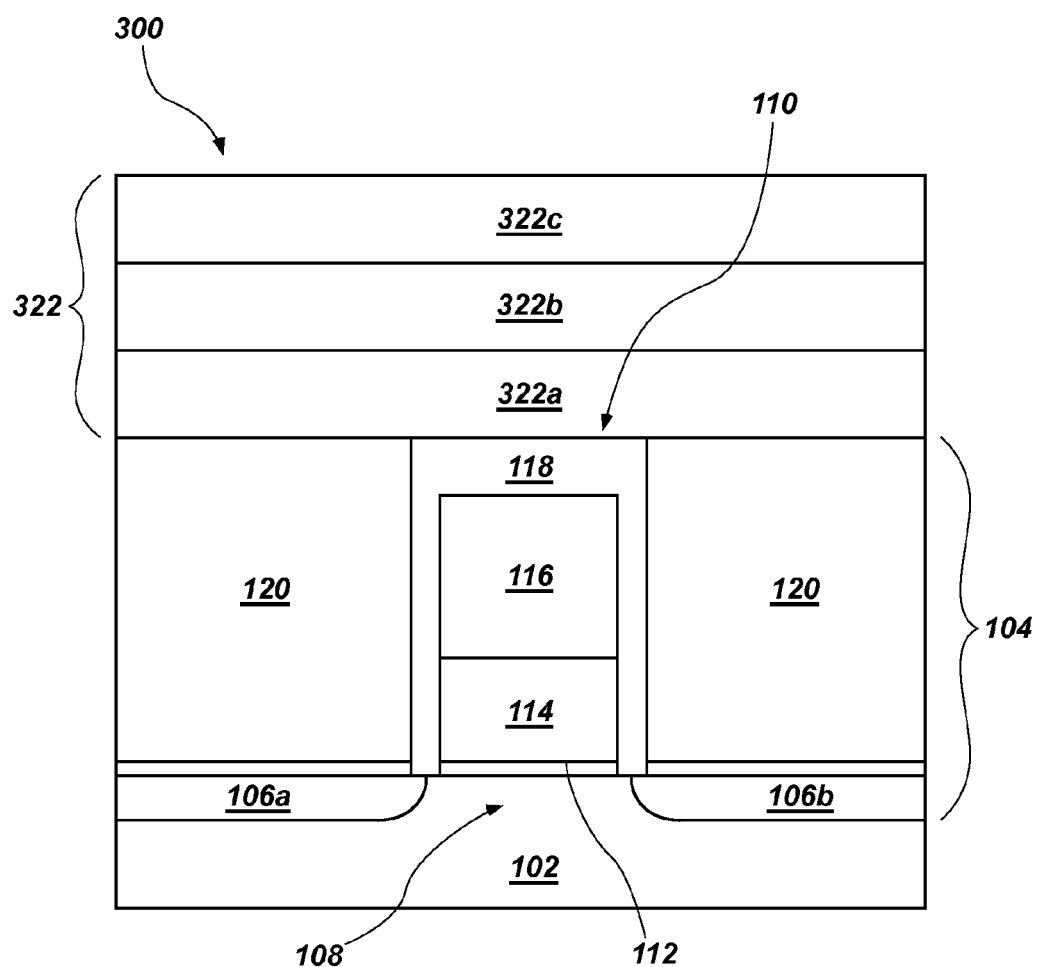
FIG. 3 is a cross-sectional view of another semiconductor device structure in accordance with embodiments of the disclosure.

Referring to FIG. 3, in further embodiments, a method of forming a semiconductor device structure 300 includes forming at least one reflective structure 322 including a single sequence or an at least partially repeating sequence of at least three different dielectric materials. As a non-limiting example, as depicted in FIG. 3, the reflective structure 322 may be formed and configured to include a dielectric material 322a on or over at least the radiation-sensitive structure 104, another dielectric material 322b on the dielectric material 322a, and an additional dielectric material 322c on the another dielectric material 322b. A refractive index contrast between one pair of adjacent dielectric materials of the reflective structure 322 (e.g., between the dielectric material 322a and the another dielectric material 322b) may be different than a refractive index contrast between another pair of adjacent dielectric materials of the reflective structure 322 (e.g., between the another dielectric material 322b and the additional dielectric material 322c). Thus, different pairs of adjacent dielectric materials may be formed to reflect radiation within different wavelength ranges. Reflecting radiation within the different wavelength ranges may, for example, promote the reflection of a particular radiation wavelength or range of radiation wavelengths (e.g., wavelength(s) within an overlapping portion of the different wavelength ranges). Alternatively, a refractive index contrast between one pair of adjacent dielectric materials of the reflective structure 322 (e.g., between the dielectric material 322a and the another dielectric material 322b) may be the same as a refractive index contrast between another pair of adjacent dielectric materials of the reflective structure 322 (e.g., between the another dielectric material 322b and the additional dielectric material 322c). Thus, different pairs of adjacent dielectric materials may be formed and configured to reflect radiation within a single wavelength range. The reflective structure 322 may be formed using conventional processes such as PVD, CVD, or ALD, which are not described in detail herein. In addition, after forming the reflective structure 322, the semiconductor device structure 300 may be subjected to additional processing (e.g., at least one plasma treatment process), such as that previously described in relation to the semiconductor device structure 100.

Figure 4:
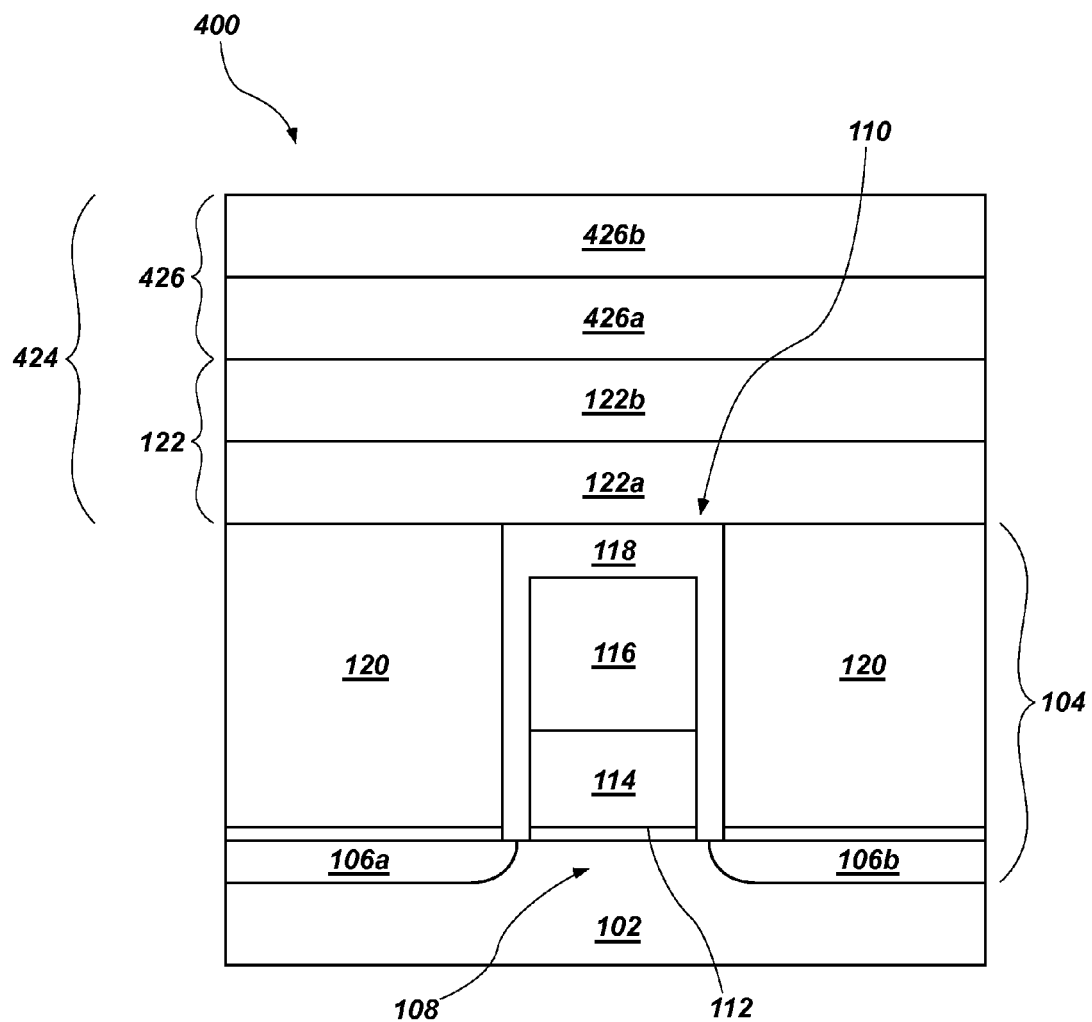
FIG. 4 is a cross-sectional view of yet another semiconductor device structure in accordance with embodiments of the disclosure.

Referring to FIG. 4, in yet further embodiments, a method of forming a semiconductor device structure 400 includes forming a plurality of reflective structures 424 on or over at least the radiation-sensitive material 104. For example, as depicted in FIG. 4, the reflective structure 122 may be formed on or over the radiation-sensitive material 104, and another reflective structure 426 may be formed on or over the reflective structure 122. The another reflective structure 426 may include a single sequence or an at least partially repeating sequence of at least two dielectric materials having different refractive indices. For example, as illustrated in FIG. 4, the another reflective structure 426 may include a first dielectric material 426a formed on or over the reflective structure 122, and a second dielectric material 426b formed on the first dielectric material 426a. A refractive index contrast between at least one pair of adjacent dielectric materials of the another reflective structure 426 (e.g., between the first dielectric material 426a and the second dielectric material 426b) may be different than a refractive index contrast between at least one pair of adjacent dielectric materials of the reflective structure 122 (e.g., between the dielectric material 122a and the another dielectric material 122b). In addition, if the another reflective structure 426 is formed on the reflective structure 122, a refractive index contrast between adjacent dielectric materials of the another reflective structure 426 and the reflective structure 122 (e.g., between the first dielectric material 426a and the another dielectric material 122b) may be different than a refractive index contrast between one or more of at least one pair of adjacent dielectric materials of the reflective structure 122 (e.g., between the dielectric material 122a and the another dielectric material 122b) and at least one pair of adjacent dielectric materials of the another reflective structure 426 (e.g., between the first dielectric material 426a and the second dielectric material 426b). Thus, the plurality of reflective structures 424 may be formed and configured to reflect radiation within multiple wavelength ranges. In further embodiments, a refractive index contrast of at least two of a pair of adjacent dielectric materials of the reflective structure 122, a pair of adjacent dielectric materials of the another reflective structure 426, and adjacent dielectric materials of the reflective structure 122 and the another reflective structure 426 may be the same. Thus, some different pairs of adjacent dielectric materials of the plurality of reflective structures 424 may be formed and configured to reflect radiation within a single wavelength range. In addition, each reflective structure (e.g., the reflective structure 122, and the another reflective structure 426) of the plurality of reflective structures 424 may be formed and configured to exhibit the same reflectivity, or at least one of the plurality of reflective structures 424 may be formed and configured to exhibit a different reflectivity than at least one other of the plurality of reflective structures 424. The plurality of reflective structures 424 may be formed using conventional processes such as PVD, CVD, or ALD, which are not described in detail herein. Further, after forming the plurality of reflective structures 424, the semiconductor device structure 400 may be subjected to additional processing (e.g., at least one plasma treatment process), such as that previously described in relation to the semiconductor device structure 100.

The methods and structures of the disclosure may improve semiconductor device (e.g., CMOS device) reliability, performance, and durability as compared to conventional methods and structures. For example, the reflective structures 122, 222, 322 and the plurality of reflective structures 424 described herein reduce radiation-based damage, defects, and impurities to at least one radiation-sensitive structure 104 (e.g., at least one CMOS transistor) of the semiconductor device structures 100, 200, 300, 400. The reflective structures 122, 222, 322 and the plurality of reflective structures 424 contribute minimal changes to the semiconductor device structures 100, 200, 300, 400 and also do not necessitate changes to plasma treatment processes used after subsequent formation of the reflective structures 122, 222, 322 and the plurality of reflective structures 424. The methods and structures of the disclosure also facilitate the selective transmission of radiation (e.g., wavelengths of radiation outside of the photonic stopband of the reflective structures 122, 222, 322, and the plurality of reflective structures 424), enabling the use of various photolithographic processes (e.g., photolithographic processes utilizing 193 nm UV radiation) in subsequent processing of the semiconductor device structures 100, 200, 300, 400. In addition, the methods and structures (e.g., the reflective structures 122, 222, 322, and the plurality of reflective structures 424) of the disclosure may enable the use of radiation-producing processing equipment to form semiconductor device structures that would at least be more difficult to form using non-radiation-producing processing equipment. Furthermore, the methods and structures of the disclosure may facilitate electrical isolation of structures within the semiconductor device structures 100, 200, 300, 400.

While embodiments of the disclosure have been described and illustrated with reference to semiconductor device structures 100, 200, 300, 400 that include transistors, such as in a CMOS device, the methods and reflective structures 122, 222, 322 and the plurality of reflective structures 424 of the disclosure may be used in other semiconductor devices in which protection of radiation-sensitive structures is desired. The reflective structures 122, 222, 322 and the plurality of reflective structures 424 of the disclosure may also be positioned in different locations on the semiconductor devices.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents. For example, elements and features disclosed in relation to one embodiment may be combined with elements and features disclosed in relation to other embodiments of the disclosure.

What is claimed is:

1. A method of forming a semiconductor device structure comprising forming at least one distributed Bragg reflector comprising at least three dielectric materials having different refractive indices than one another on an upper surface of a gate structure of a transistor and on an upper surface of an electrically insulative material laterally surrounding the gate structure, the at least one distributed Bragg reflector configured to substantially reflect therefrom radiation within a predetermined wavelength range and to substantially transmit therethrough radiation within a different predetermined wavelength range.

2. The method of claim 1, wherein forming at least one distributed Bragg reflector comprises forming the at least one distributed Bragg reflector to reflect therefrom greater than or equal to about 60 percent of radiation within a wavelength range of from about 200 nanometers to about 400 nanometers.

3. The method of claim 1, wherein forming at least one distributed Bragg reflector comprises forming the at least one distributed Bragg reflector configured to transmit therethrough radiation having a wavelength of less than about 200 nanometers.

4. The method of claim 1, wherein forming at least one distributed Bragg reflector comprises:
   forming a dielectric material on the upper surface of the gate structure and on the upper surface of the electrically insulative material;
   forming another dielectric material on the dielectric material, the another dielectric material having a different refractive index than the dielectric material; and
   forming at least one additional dielectric material on the another dielectric material, the at least one additional dielectric material having a different refractive index than the dielectric material and the another dielectric material.

5. The method of claim 1, wherein forming at least one distributed Bragg reflector comprises:
   forming a first distributed Bragg reflector on the upper surface of the gate structure and on the upper surface of the electrically insulative material; and forming a second distributed Bragg reflector on the first distributed Bragg reflector.

6. The method of claim 1, wherein forming at least one distributed Bragg reflector comprises forming a pair of adjacent dielectric materials of the at least three dielectric materials to have a different refractive index contrast than another pair of adjacent dielectric materials of the at least three dielectric materials.

7. The method of claim 1, further comprising exposing the at least one distributed Bragg reflector to ultraviolet radiation and reflecting at least some of the ultraviolet radiation with the at least one distributed Bragg reflector.

8. The method of claim 7, wherein exposing the at least one distributed Bragg reflector to ultraviolet radiation comprises exposing the at least one distributed Bragg reflector to ultraviolet radiation produced during a subsequent plasma treatment process.

9. The method of claim 8, wherein exposing the at least one distributed Bragg reflector to ultraviolet radiation produced during a subsequent plasma treatment process comprises exposing the at least one distributed Bragg reflector to ultraviolet radiation produced from at least one of a plasma enhanced chemical vapor deposition process, a plasma etching process, and a plasma cleaning process.

10. The method of claim 1, wherein forming at least one distributed Bragg reflector comprises forming each of the at least three dielectric materials to independently comprise a different dielectric material selected from the group consisting of $SiO_2$, $Si_3N_4$, $ZrO_2$, $HfO_2$, $TiO_2$, $Ta_2O_5$, MgO, Group III-V compounds, and Group II-IV compounds.

11. The method of claim 1, wherein forming at least one distributed Bragg reflector comprises forming the at least one distributed Bragg reflector on surfaces of the gate structure and the electrically insulative material substantially coplanar with one another.

12. A method of forming a semiconductor device structure, comprising:
    forming adjacent distributed Bragg reflectors each independently configured to selectively reflect radiation having a wavelength within a range of from about 200 nm to about 400 nm over at least one material of a semiconductor device structure, a first of the adjacent distributed Bragg reflectors comprising a first pair of adjacent dielectric materials, and a second of the adjacent distributed Bragg reflectors comprising a second pair of adjacent dielectric materials having a different refractive index contrast than the first pair of adjacent dielectric materials; and
    exposing the adjacent distributed Bragg reflectors to radiation having a wavelength within a range of from about 200 nm to about 400 nm.

13. The method of claim 12, wherein forming adjacent distributed Bragg reflectors comprises forming the first of the adjacent distributed Bragg reflectors to comprise a dielectric material having a refractive index of greater than or equal to about 2.0 on another dielectric material having a different refractive index of less than or equal to about 2.0.

14. The method of claim 13, wherein forming the first of the adjacent distributed Bragg reflectors comprises:
    selecting the dielectric material from the group consisting of $SiO_2$, $Si_3N_4$, $TiO_2$, $ZrO_2$, $HfO_2$, $Ta_2O_5$, and MgO; and
    selecting the another dielectric material to comprise a different material from the group consisting of $SiO_2$, $Si_3N_4$, $TiO_2$, $ZrO_2$, $HfO_2$, $Ta_2O_5$, and MgO.

15. A method of processing a semiconductor device structure comprising:
    forming a distributed Bragg reflector on an electrically insulative capping material of a gate structure of a transistor, the distributed Bragg reflector comprising different, adjacent dielectric materials selected from the group consisting of $SiO_2$, $Si_3N_4$, $ZrO_2$, $HfO_2$, $Ta_2O_5$, MgO, Group III-V compounds, and Group II-IV compounds; and
    substantially reflecting UV radiation within a predetermined wavelength range away from the radiation-sensitive structure with the distributed Bragg reflector; and
    substantially transmitting UV radiation outside of the predetermined wavelength range through the distributed Bragg reflector to the radiation-sensitive structure.

16. The method of claim 15, further comprising conducting a plasma etch process on the semiconductor device structure to produce the UV radiation within the predetermined wavelength range.

17. The method of claim 15, further comprising photoscanning the semiconductor device structure with the UV radiation outside of the predetermined wavelength range.

18. The method of claim 15, wherein forming the distributed Bragg reflector comprises forming the distributed Bragg reflector to comprise $SiO_2$ vertically adjacent $Si_3N_4$.

19. The method of claim 15, wherein forming the distributed Bragg reflector comprises forming at least one of the different, adjacent dielectric materials to exhibit a different thickness than at least one other of the different, adjacent dielectric materials.

* * * * *